United States Patent
Katti et al.

(10) Patent No.: US 7,183,042 B2
(45) Date of Patent: Feb. 27, 2007

(54) BIT END DESIGN FOR PSEUDO SPIN VALVE (PSV) DEVICES

(75) Inventors: Romney R. Katti, Maple Grove, MN (US); Paul S. Fechner, Plymouth, MN (US); Gordon A. Shaw, Plymouth, MN (US); Daniel S. Reed, Maple Plain, MN (US); David W. Zou, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 491 days.

(21) Appl. No.: 10/706,067

(22) Filed: Nov. 12, 2003

(65) Prior Publication Data

US 2005/0101079 A1    May 12, 2005

(51) Int. Cl.
*G03F 7/20* (2006.01)
(52) U.S. Cl. .................. 430/320; 430/313; 430/314; 430/316; 430/318
(58) Field of Classification Search .............. None
See application file for complete search history.

(56) References Cited

U.S. PATENT DOCUMENTS

| | | | |
|---|---|---|---|
| 4,731,757 A * | 3/1988 | Daughton et al. | ......... 365/173 |
| 5,695,864 A | 12/1997 | Slonczewski | |
| 5,949,707 A | 9/1999 | Pohm et al. | |
| 5,966,322 A | 10/1999 | Pohm et al. | |
| 6,317,359 B1 | 11/2001 | Black et al. | |
| 6,392,924 B1 | 5/2002 | Liu et al. | |
| 2004/0188382 A1 * | 9/2004 | Mikelson et al. | ............. 216/54 |

OTHER PUBLICATIONS

James Daughton, Magnetoresistive Random Access Memory (MRAM), Feb. 4, 2000, pp. 1-13.

* cited by examiner

*Primary Examiner*—John A. McPherson
(74) *Attorney, Agent, or Firm*—McDonnell Boehnen Hulbert & Berghoff LLP

(57) ABSTRACT

In a process of making a magnetoresistive memory device, a mask layout is produced by use of any suitable design tool. The mask layout is laid out in grids having a central grid forming a central section and grids forming bit end sections, and the grids of the bit end sections are rectangles. A mask is made by use of the mask layout, and the mask has stepped bit ends. The mask is used to make a magnetic storage layer having tapered bit ends, to make a magnetic sense layer having tapered bit ends, and to make a non-magnetic layer having tapered bit ends. The non-magnetic layer is between the magnetic sense layer and the magnetic storage layer.

24 Claims, 5 Drawing Sheets

BIT END DESIGN FOR PSEUDO SPIN VALVE (PSV) DEVICES

The Government has rights in this invention pursuant to Contract No. DTRA01-00-C-002 awarded by the Defense Threat Reduction Agency.

TECHNICAL FIELD OF THE INVENTION

The present invention relates to spin valve and pseudo spin valve devices, such as giant magnetoresistive devices, that have improved bit end designs.

BACKGROUND OF THE INVENTION

A magnetoresistive random access memory is a memory that is typically fabricated from anisotropic magnetoresistance materials or from giant magnetoresistance materials to form a plurality of memory cells. The cells of early magnetoresistive random access memories, such as anisotropic magnetoresistive memories, used magnetic hysteresis to store data, and the cells were read using the cells' magnetoresistance. Such cells could be integrated on an integrated circuit chip. A cell of such a memory typically comprised two ferromagnetic layers sandwiching a conductor.

Giant magnetoresistance materials permit higher signals and faster read access time as compared to anisotropic magnetoresistive materials. A pseudo spin valve cell can be formed by sandwiching an appropriate electrically conducting non-magnetic layer between two magnetic films. This cell shows a greater change in magnetoresistance than that achieved with the anisotropic magnetoresistive effect.

The pseudo spin valve (PSV) cell supports the operation of a magnetoresistive random access memory (MRAM). A pseudo spin valve typically has two magnetic layers that sandwich a non-magnetic conductive layer therebetween. The two magnetic layers are designed so that one layer tends to switch at lower fields than the other. The difference in switching fields may be obtained, for example, by using two magnetic films of the same material, but with different thicknesses. In this case, the thinner film switches at lower fields, and the thicker film switches at higher fields. The resistance of the pseudo spin valve is lowest at fields where the magnetization of the thicker film is aligned in the direction of the magnetization of the thinner film. The thinner film is used to read the storage state that is stored in the thicker film.

In the pseudo spin valve structure, the magnetization of the two magnetic layers can be predominantly anti-parallel or parallel, making the resistance of the film high or low, respectively. The stored bit is read non-destructively by applying a sense current together with a negative and then a positive word current. For read, the word current magnitude is chosen such that the magnetic field generated by the word current in the presence of the sense current is enough to switch the thinner magnetic layer, but not enough to switch the thicker magnetic layer used to store data. For write, the word current magnitude is chosen such that the magnetic field generated by the word and digit and/or sense currents switches the addressed, selected thicker magnetic layer without disturbing the other memory cells.

FIG. 1 shows the successful write characteristic of a pseudo spin valve, and FIG. 2 shows the successful read characteristic of a pseudo spin valve. FIG. 3 shows the write cycling error that appears as a read disturbance error in which the thicker storage magnetic film is switched prematurely at the selected write current under selected-device write conditions. A biased remnant magnetization, for example, which can result from biasing from the digit and/or sense current, can enable selected write switching at the selected write switching field during a read cycle. Accordingly, the change in resistance dR of the pseudo spin valve can be reduced, for example, by 50%. This reduction in dR can occur, for example, because the sustained rotated magnetization initiated and/or sustained in the device, including the bit ends, can allow the magnetization between the thin and thick layers to be not fully parallel and/or anti-parallel. Also, switching asymmetry and variability can be caused by a bias resulting from remnant magnetization states in the bit induced by the vector sum of the digit, sense, and/or word fields. Undesired switching of the magnetization can result from less than optimal bit ends of the individual storage pseudo spin valve devices, particularly in instances when magnetization reversal is initiated in bit ends.

The present invention is directed to a magnetoresistive device such as a magnetoresistive memory device, an anisotropic magnetoresistive memory device, a giant magnetoresistive memory device, a pseudo spin valve memory device, a spin valve memory valve, etc. having end shapes that mitigate or eliminate one or more of these or other problems.

SUMMARY OF THE INVENTION

In accordance with one aspect of the present invention, a process of making a magnetoresistive memory device comprises the following: making a mask having stepped bit ends; using the mask to make a magnetic storage layer having tapered bit ends; using the mask to make a magnetic sense layer having tapered bit ends; and, using the mask to make a non-magnetic layer between the magnetic sense layer and the magnetic storage layer, and wherein the non-magnetic layer has tapered bit ends.

In accordance with another aspect of the present invention, a process of making a magnetoresistive memory device comprises the following: laying out a mask layout in grids having a central grid forming a central section and outer grids forming bit end sections, and wherein the grids of the bit end sections are rectangles; making a mask by use of the mask layout, wherein the mask has stepped bit ends; using the mask to make a magnetic storage layer having tapered bit ends; using the mask to make a magnetic sense layer having tapered bit ends; and, using the mask to make a non-magnetic layer between the magnetic sense layer and the magnetic storage layer, wherein the non-magnetic layer has tapered bit ends.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
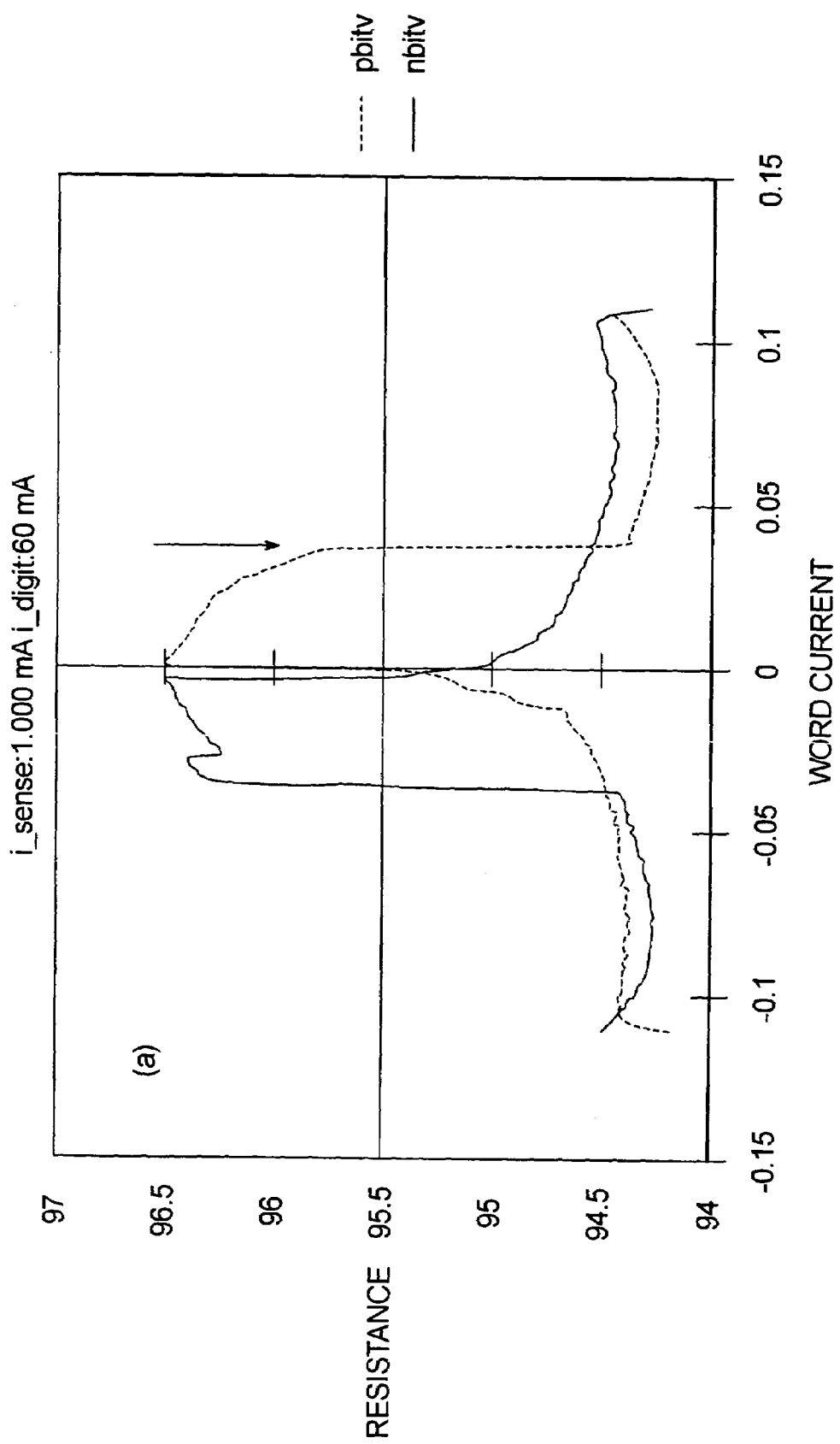
FIG. 1 illustrates a successful write characteristic of a pseudo spin valve.
Figure 2:
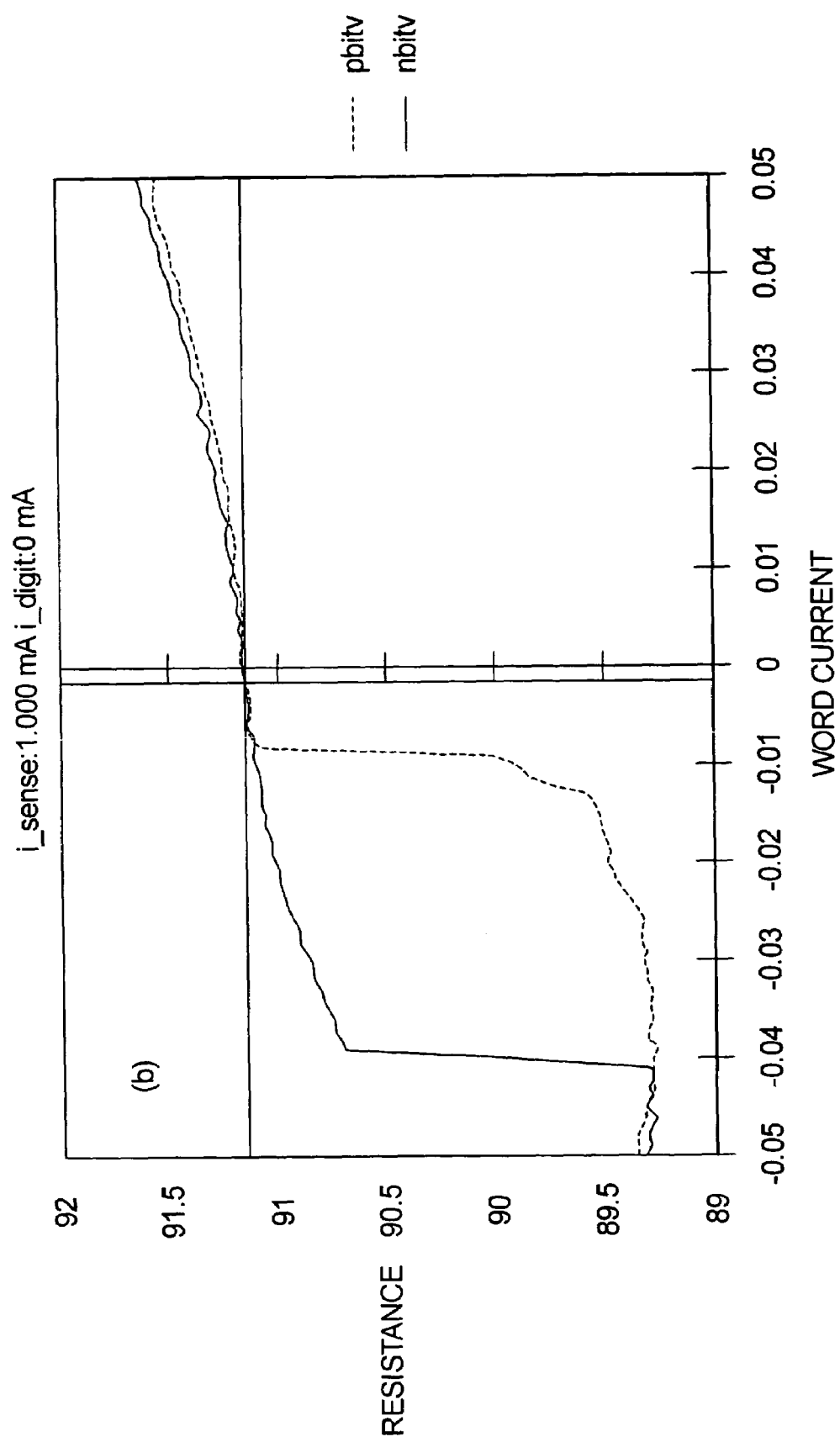
FIG. 2 illustrates a successful read characteristic of a pseudo spin valve.
Figure 3:
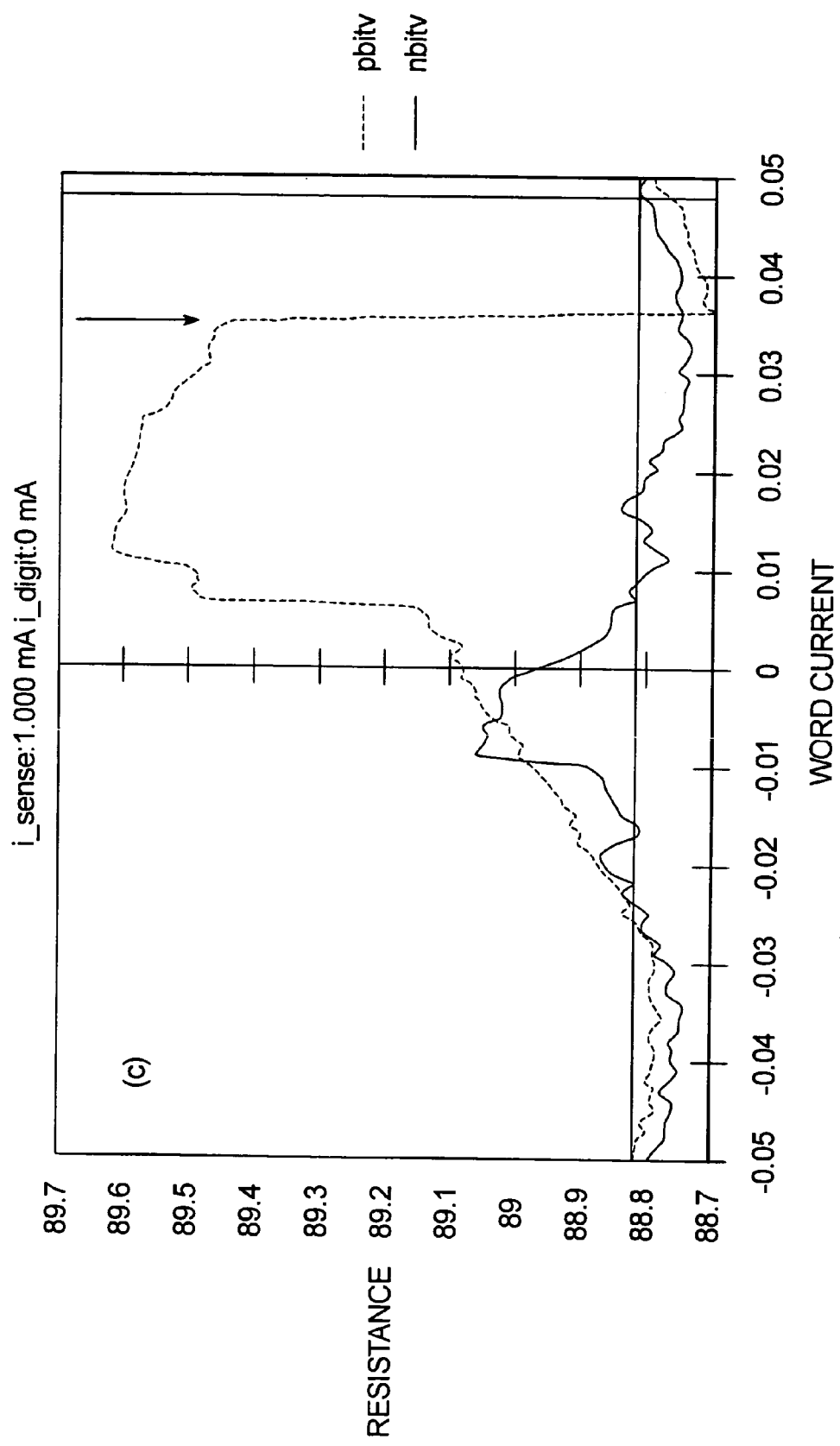
FIG. 3 illustrates a write cycling error that appears as a read disturbance error when the thicker storage magnetic film of pseudo spin valve device is ascertained to have switched prematurely.
Figure 4:
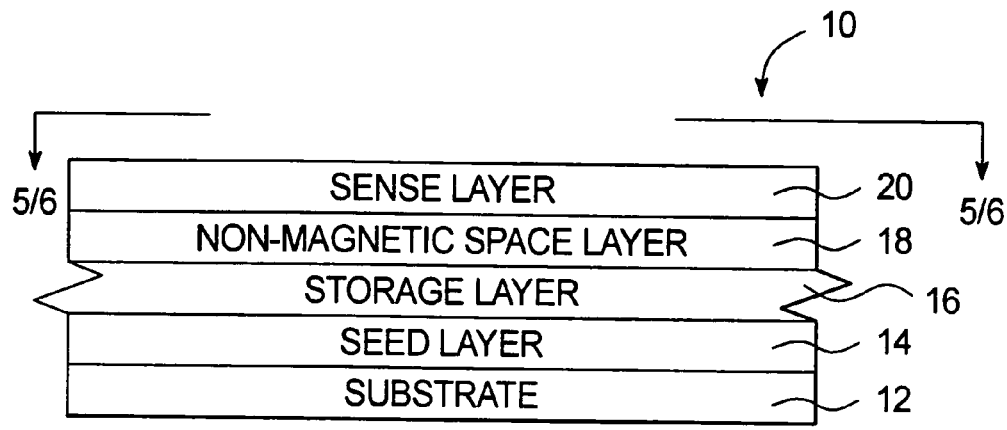
FIG. 4 illustrates a pseudo spin valve device cross-section whose bit ends can be shaped according to the present invention.

As shown in FIG. 4, a pseudo spin valve memory device 10 has a substrate 12, a seed layer 14, a magnetic storage layer 16, a non-magnetic, electrically conductive layer 18, and a magnetic sense layer 20. The seed layer 14 may be formed, such as by sputter deposition of silicon oxide(s), silicon nitride or tantalum, on the substrate 12. The substrate 12 may be silicon. The seed layer 14 is optional. The magnetic storage layer 16, for example, may be a ferromagnetic alloy or multilayer such as NiFeCo, NiFe/CoFe, NiFe, or CoFe, and the magnetic storage layer 16 may have a thickness, for example, of between 1 nm and 10 nm. The magnetic storage layer 16 is used to write the data stored in the pseudo spin valve memory device 10.

If desired, a cap-layer, for example made of Ta, may be suitably formed over the sense layer 20.

The non-magnetic, electrically conductive layer 18 is formed over the magnetic storage layer 16. For example, the non-magnetic, electrically conductive layer 18 may be copper. The non-magnetic, electrically conductive layer 18 may have a thickness, for example, of between 2 nm and 4 nm.

The magnetic sense layer 20 is formed over the non-magnetic, electrically conductive layer 18. The magnetic sense layer 20, for example, may be a ferromagnetic alloy or multilayer such as NiFeCo, NiFe/CoFe, NiFe, or CoFe, and the magnetic sense layer 20 may have a thickness, for example, of between 1 nm and 10 nm. The magnetic sense layer 20 is used to read data from the pseudo spin valve memory device 10.

Figure 5:
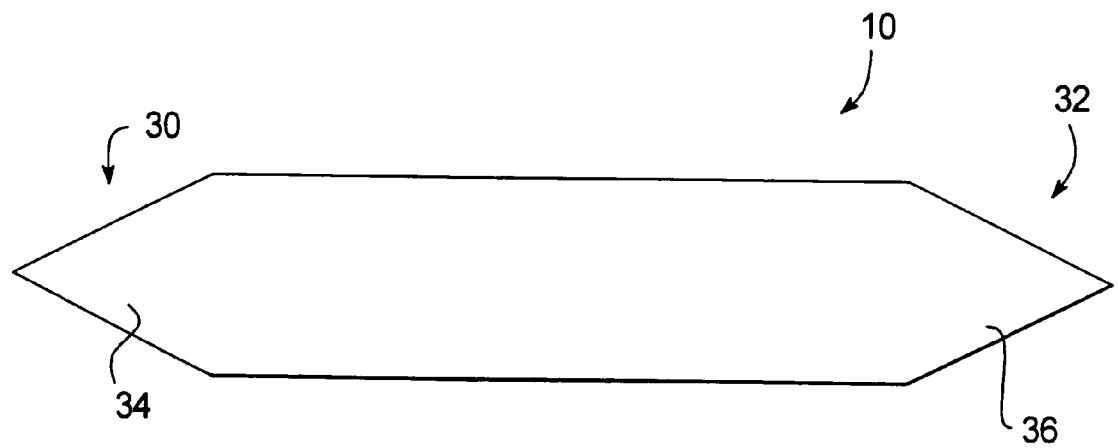
FIG. 5 illustrates a top view of the pseudo spin valve of FIG. 4 with the desired tapered bit ends.

FIG. 5 is a top down view of the pseudo spin valve memory device 10. The pseudo spin valve memory device 10 has ends 30 and 32 that are tapered. Each of the layers of the pseudo spin valve memory device 10 may have the same taper which, if desired, may be formed using a single mask treatment. Accordingly, the ends of the magnetic sense layer 20 have the taper shown by the ends 30 and 32 in FIG. 5, the ends of the non-magnetic, electrically conductive layer 18 that is below the magnetic sense layer 20 have the same taper as shown by the ends 30 and 32, and the ends of the magnetic storage layer 16 that is below the non-magnetic, electrically conductive layer 18 have the same taper as shown by the ends 30 and 32. The ends 30 and 32 are corresponding bit ends 34 and 36 of the pseudo spin valve memory device 10.

The mask that is typically used to prepare a pseudo spin valve memory device having tapered bits ends has tapered ends that follow the taper of the ends 30 and 32 shown in FIG. 5. However, this mask produces pseudo spin valve memory devices that generate substantial errors, and results in poor yields in the production of pseudo spin valve memory devices. One reason for these errors is the variability induced in the mask making process due to an angled taper.

Figure 6:
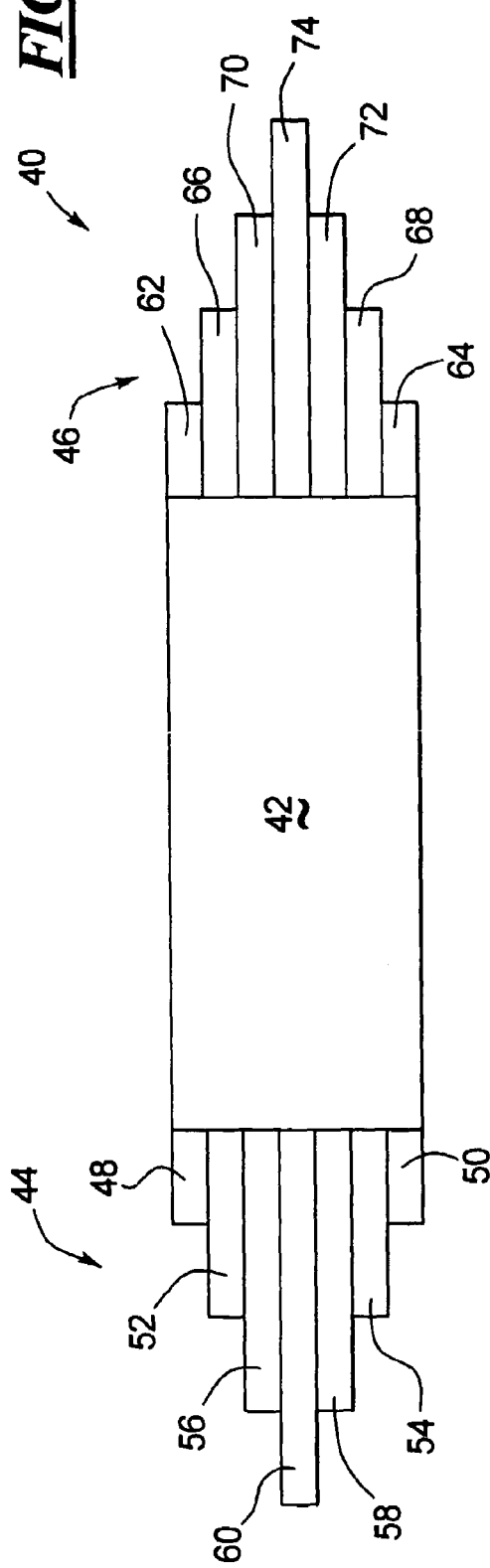
FIG. 6 illustrates a top view of the mask layout that is used to produce the mask that generates the pseudo spin valve with the tapered bit ends shown as viewed in FIG. 5; and, FIG. 7 illustrates the mask design and mask that is produced by the mask layout of FIG. 6 and that generates the pseudo spin valve device with the tapered bit ends shown as view in FIG. 5.

A top view of a mask layout 40 that is used to generate an improved mask that in turn is used to produce the pseudo spin valve memory device 10 is shown in FIG. 6. A design tool can be used to make the mask layout 40. The design tool lays out the mask layout 40 in a grid configuration that matches the grid spacing used in making the mask. As shown in FIG. 6, the design tool lays out the mask layout 40 in a grid configuration such that the mask layout 40 has a central rectangular section 42 and rectangular stepped sections 44 and 46 at either end of the central rectangular section 42. Thus, the rectangular stepped section 44 has outer rectangles 48 and 50, first inner rectangles 52 and 54, second inner rectangles 56 and 58, and a center rectangle 60. The first inner rectangles 52 and 54 are between the outer rectangles 48 and 50 and the second inner rectangles 56 and 58, and the second inner rectangles 56 and 58 are between the first inner rectangles 52 and 54 and the center rectangle 60. Also, the first inner rectangles 52 and 54 are longer than the outer rectangles 48 and 50 but shorter than the second inner rectangles 56 and 58, and the second inner rectangles 56 and 58 are longer than the first inner rectangles 52 and 54 and shorter than the center rectangle 60.

The rectangular stepped section 46 has outer rectangles 62 and 64, first inner rectangles 66 and 68, second inner rectangles 70 and 72, and a center rectangle 74. The first inner rectangles 66 and 68 are between the outer rectangles 62 and 64 and the second inner rectangles 70 and 72, and the second inner rectangles 70 and 72 are between the first inner rectangles 66 and 68 and the center rectangle 74. Also, the first inner rectangles 66 and 68 are longer than the outer rectangles 62 and 64 but shorter than the second inner rectangles 70 and 72 and the second inner rectangles 70 and 72 are longer than the first inner rectangles 66 and 68 and shorter than the center rectangle 74.

Moreover, the outer rectangles 48 and 50 of the rectangular stepped section 44 and the outer rectangles 62 and 64 of the rectangular stepped section 46 may be of equal length, the first inner rectangles 52 and 54 of the rectangular stepped section 44 and the first inner rectangles 66 and 68 of the rectangular stepped section 46 may be of equal length, the second inner rectangles 56 and 58 of the rectangular stepped section 44 and the second inner rectangles 70 and 72 of the rectangular stepped section 46 may be of equal length, and the center rectangle 60 of the rectangular stepped section 44 and the center rectangle 74 of the rectangular stepped section 46 may be of equal length.

The size of each of the steps 48–60 and 62–74 and the center section 42 may have any suitable sizes.

Figure 7:
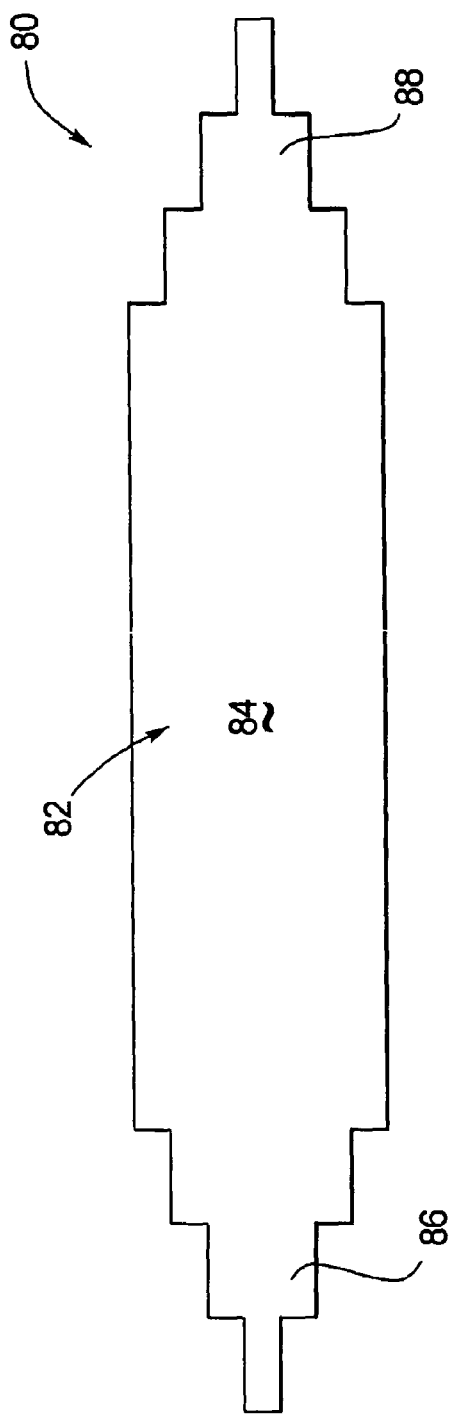

The mask layout 40 is used to make a mask 80 that is shown in FIG. 7. The mask 80 includes an opening 82 having a central section 84 and bit end sections 86 and 88. As can be seen, the central section 84 of the opening 82 corresponds to the central rectangular section 42 of the mask layout 40, the bit end section 86 of the opening 82 corresponds to the rectangular stepped section 44 of the mask layout 40, and the bit end section 88 of the opening 82 corresponds to the rectangular stepped section 46 of the mask layout 40.

The mask 80 is used to make each layer of the pseudo spin valve memory device 10. Thus, the mask 80 is used to make magnetic storage layer 16, the non-magnetic, electrically conductive layer 18, and the magnetic sense layer 20. These layers can be processed together in a single lithographic patterning step or separately, as desired. The mask 80 with the stepped or rectangular bit end sections 86 and 88 results in pseudo spin valve memory devices having fewer errors and higher yields. For example, uncertainty of the taper design is reduced because of the matching of the dimensions of the rectangular steps to the mask and fabrication technology. Moreover, the steps of the mask 80 as shown in FIG. 7 can be arranged to produce bit ends having the desired bit end profile and using desired criteria such as linear, quadratic, and higher ordered or other profiles or shapes.

Certain modifications of the present invention will occur to those practicing in the art of the present invention. For example, multiple memory devices such as the pseudo spin valve memory device 10 may be provided to form magnetoresistive random access memories (MRAMs). Also, electronics may be formed in a substrate (not shown) that can be used during fabrication of the pseudo spin valve memory device 10 to aid in the storing of information and the reading of that information. The substrate may be silicon.

Additionally, the pseudo spin valve memory device 10 is shown as having a single magnetic storage layer 16, a non-magnetic, electrically conductive layer 18, and a magnetic sense layer 20. Each of these layers may comprise more than one film, and each film may comprise a different material. For example, a first of the films in the magnetic storage layer 16 may be a NiFe film, and a second of the films in the magnetic storage layer 16 may be a CoFe film. Similarly, a first of the films in the magnetic sense layer 20 may be a NiFe film, and a second of the films in the magnetic sense layer 20 may be a CoFe film.

Furthermore, the bit ends of the present invention have been described above in relation to pseudo spin valve memory devices. However, the bit ends of the present invention may also be used for other memory devices such as anisotropic magnetoresistive memory devices and other giant magnetoresistive memory devices.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A process of making a magnetoresistive memory device comprising:
   making a mask having stepped bit ends;
   using the mask to make a magnetic storage layer having tapered bit ends;
   using the mask to make a magnetic sense layer having tapered bit ends; and,
   using the mask to make a non-magnetic layer between the magnetic sense layer and the magnetic storage layer, and wherein the non-magnetic layer has tapered bit ends.

2. The process of claim 1 wherein the magnetic storage layer comprises more than one magnetic storage film.

3. The process of claim 1 wherein the magnetic storage layer comprises first and second magnetic storage films, wherein the first magnetic storage film comprises NiFe, and wherein the second magnetic storage film comprises CoFe.

4. The process of claim 1 wherein the magnetic sense layer comprises more than one magnetic sense film.

5. The process of claim 1 wherein the magnetic sense layer comprises first and second magnetic sense films, wherein the first magnetic sense film comprises NiFe, and wherein the second magnetic sense film comprises CoFe.

6. The process of claim 1 wherein the magnetic storage layer comprises more than one magnetic storage film, and wherein the magnetic sense layer comprises more than one magnetic sense film.

7. The process of claim 1 wherein the magnetic storage layer comprises first and second magnetic storage films, wherein the magnetic sense layer comprises first and second magnetic sense films, wherein the first magnetic storage film comprises NiFe, wherein the second magnetic storage film comprises CoFe, wherein the first magnetic sense film comprises NiFe, and wherein the second magnetic sense film comprises CoFe.

8. The process of claim 1 wherein the magnetic sense film comprises a ferromagnetic sense film.

9. The process of claim 1 wherein the magnetic storage film comprises a ferromagnetic storage film.

10. The process of claim 9 wherein the magnetic sense film comprises a ferromagnetic sense film.

11. The process of claim 1 wherein the using of the mask to make a magnetic storage layer having tapered bit ends, the using of the mask to make a magnetic sense layer having tapered bit ends, and the using of the mask to make a non-magnetic layer between the magnetic sense layer and the magnetic storage layer are performed in a single lithographic patterning step.

12. The process of claim 1 wherein the using of the mask to make a magnetic storage layer having tapered bit ends, the using of the mask to make a magnetic sense layer having tapered bit ends, and the using of the mask to make a non-magnetic layer between the magnetic sense layer and the magnetic storage layer are performed as separate lithographic patterning steps.

13. A process of making a magnetoresistive memory device comprising:
   laying out a mask layout in grids having a central grid forming a central section and outer grids forming bit end sections, and wherein the grids of the bit end sections are rectangles;
   making a mask by use of the mask layout, wherein the mask has stepped bit ends;
   using the mask to make a magnetic storage layer having tapered bit ends;
   using the mask to make a magnetic sense layer having tapered bit ends; and,
   using the mask to make a non-magnetic layer between the magnetic sense layer and the magnetic storage layer, wherein the non-magnetic layer has tapered bit ends.

14. The process of claim 13 wherein the magnetic storage layer comprises more than one magnetic storage film.

15. The process of claim 13 wherein the magnetic storage layer comprises first and second magnetic storage films, wherein the first magnetic storage film comprises NiFe, and wherein the second magnetic storage film comprises CoFe.

16. The process of claim 13 wherein the magnetic sense layer comprises more than one magnetic sense film.

17. The process of claim 13 wherein the magnetic sense layer comprises first and second magnetic sense films, wherein the first magnetic sense film comprises NiFe, and wherein the second magnetic sense film comprises CoFe.

18. The process of claim 13 wherein the magnetic storage layer comprises more than one magnetic storage film, and wherein the magnetic sense layer comprises more than one magnetic sense film.

19. The process of claim 13 wherein the magnetic storage layer comprises first and second magnetic storage films, wherein the magnetic sense layer comprises first and second magnetic sense films, wherein the first magnetic storage film comprises NiFe, wherein the second magnetic storage film comprises CoFe, wherein the first magnetic sense film comprises NiFe, and wherein the second magnetic sense film comprises CoFe.

20. The process of claim 13 wherein the magnetic sense film comprises a ferromagnetic sense film.

21. The process of claim 13 wherein the magnetic storage film comprises a ferromagnetic storage film.

22. The process of claim 21 wherein the magnetic sense film comprises a ferromagnetic sense film.

23. The process of claim 13 wherein the using of the mask to make a magnetic storage layer having tapered bit ends, the using of the mask to make a magnetic sense layer having tapered bit ends, and the using of the mask to make a non-magnetic layer between the magnetic sense layer and the magnetic storage layer are performed in s single lithographic patterning step.

24. The process of claim 13 wherein the using of the mask to make a magnetic storage layer having tapered bit ends, the using of the mask to make a magnetic sense layer having tapered bit ends, and the using of the mask to make a non-magnetic layer between the magnetic sense layer and the magnetic storage layer are performed as separate lithographic patterning steps.

* * * * *